United States Patent [19]

Malchow

[11] 4,370,520
[45] Jan. 25, 1983

[54] AM STEREO RECEIVER

[75] Inventor: Max E. Malchow, Flemington, N.J.

[73] Assignee: RCA Corporation, New York, N.Y.

[21] Appl. No.: 266,984

[22] Filed: May 26, 1981

[51] Int. Cl.³ .......................... H04B 1/12; H04H 5/00
[52] U.S. Cl. ................................ 179/1 GS; 455/239; 455/246
[58] Field of Search ............ 179/1 GS; 455/234, 239, 455/240, 241, 244, 246, 247

[56] References Cited

U.S. PATENT DOCUMENTS

| | | | |
|---|---|---|---|
| 2,144,008 | 1/1939 | Barber | 455/244 |
| 3,076,057 | 1/1963 | Baugh, Jr. | 179/1 GS |
| 4,121,161 | 10/1978 | Ohsawa | 455/234 |
| 4,270,223 | 5/1981 | Marston | 455/239 X |

OTHER PUBLICATIONS

Proposal entitled, "In the Matter of AM Stereophonic Broadcasting," Docket No. 21313, submitted to the Federal Communication Commission, pp. 30-32.

Primary Examiner—R. J. Hickey
Attorney, Agent, or Firm—E. M. Whitacre; P. J. Rasmussen; P. M. Emanuel

[57] ABSTRACT

An AM stereo receiver includes an AGC system with first and second AGC system characteristics. The first AGC system characteristic provides a relatively constant receiver output signal for increasing received signal strength, i.e., a hard AGC characteristic. The second AGC characteristic provides a somewhat increasing receiver output signal for increasing received signal strength, i.e., a soft AGC system characteristic. A tuning detector is used to detect when the receiver is being tuned. When the receiver is being tuned, the AGC system is conditioned to provide a relatively soft AGC characteristic, which facilitates accurate receiver tuning. When the receiver is not being tuned, the AGC system is conditioned to provide a relatively hard AGC characteristic, which facilitates accurate left and right stereo channel separation.

5 Claims, 3 Drawing Figures

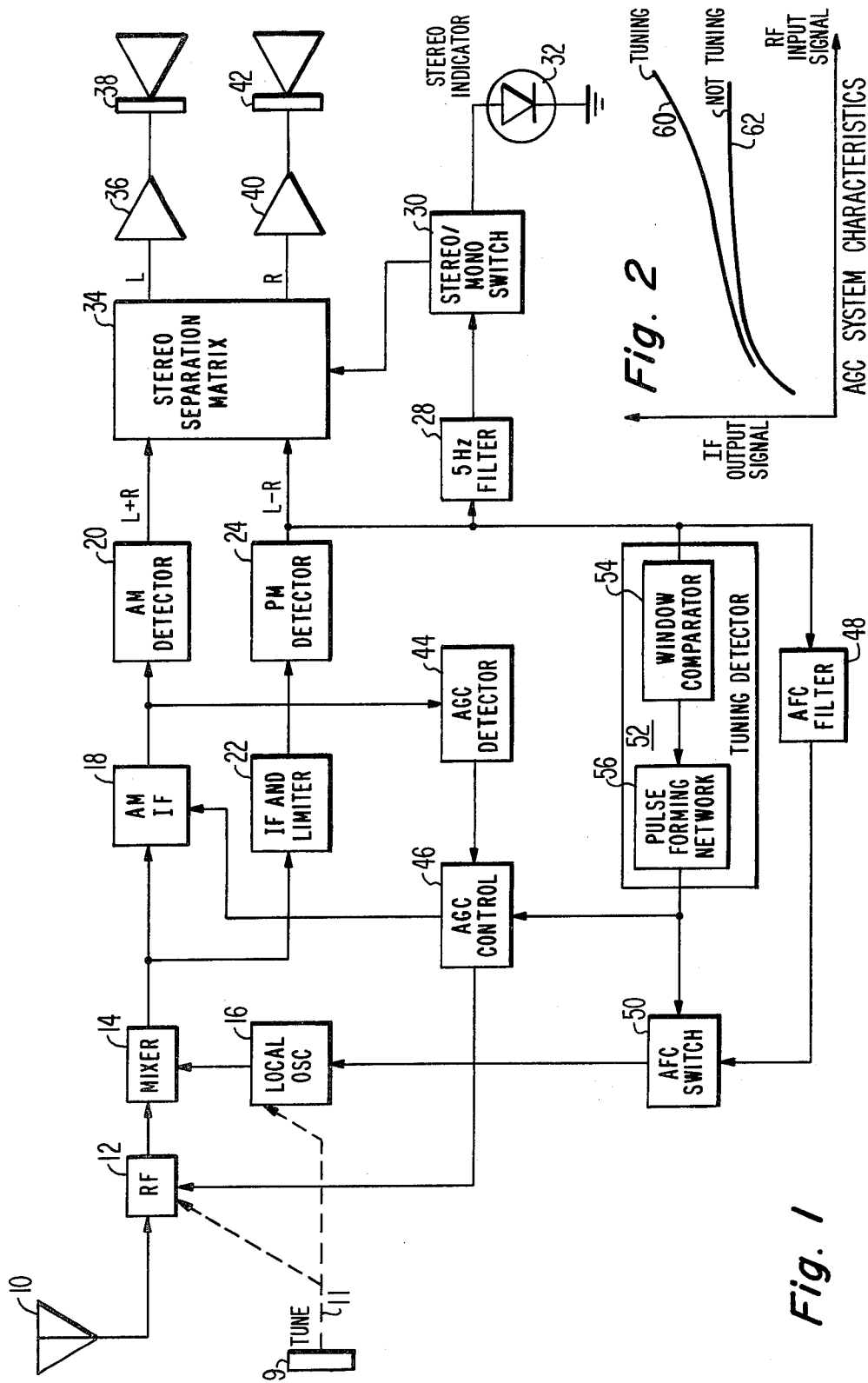

AM STEREO RECEIVER

FIELD OF THE INVENTION

This invention relates to AM stereo receivers.

BACKGROUND OF THE INVENTION

Several systems have been proposed for transmitting stereo program material on the amplitude modulated (AM) carriers in the AM band, i.e., 540-1650 kilocycles. For example, see the proposal entitled "In The Matter of AM Stereophonic Broadcasting," docket No. 21313, submitted by Magnavox Consumer Electronics Company to the Federal Communications Commission.

In the Magnavox system, the left (L) channel audio signal and the right (R) channel audio signal are summed together to form an L+R signal. The L+R signal is used to amplitude modulate the radio frequency (RF) carrier signal in the normal manner. A difference signal, L−R, is used to phase modulate (PM) the RF carrier signal. The presence of stereo modulation is indicated by frequency modulating (FM) the RF carrier signal with a subsonic 5 hertz signal.

At the receiver, the L+R signal is recovered by an amplitude detector. The L−R signal is recovered by a phase detector. The L channel is separated from the R channel by summing the L+R signal with the L−R signal in order to cancel the R signal component. The R channel is separated from the L channel by subtracting the L−R signal from the L+R signal in order to cancel the L signal component.

The degree of separation between the left and right channels is dependent on the equality of the amplitudes of the demodulated L+R and L−R signals. That is, to the extent that the amplitude of the L+R signal is not the same as the amplitude of the L−R signal, the respective cancellation of L and R signal components will not be accurate, leaving a portion of the R signal in the separated L channel, and vice versa.

The amplitude of the demodulated L−R signal is relatively unaffected by the RF signal strength at the reciever. This is so because the amplitude of the L−R signal depends upon the phase and not the amplitude of the received signal. On the other hand, since the RF carrier is amplitude modulated in accordance with the L+R signal, the amplitude of the demodulated L+R signal is directly related to the RF signal strength at the receiver.

An automatic gain control (AGC) system may be used in the receiver to maintain the amplitude of the demodulated L+R signal at a relatively constant level regardless of the received RF signal strength. For purposes of channel separation, the AGC system should provide a nearly constant output, i.e., a relatively flat characteristic. An AGC system having a relatively flat characteristic is called a "hard" AGC system. A hard AGC system creates a problem in tuning a desired station. During tuning, when a station is first encountered, a hard AGC system provides full volume before the user accurately tunes the receiver to the station frequency. If the signal strength at the receiver is strong enough, the received audio signal will be acceptable even though the receiver is slightly mistuned. However, if the received RF signal strength decreases, such as in an automobile radio in a moving vehicle, then the received audio signal will become unacceptable and the receiver require further tuning. Received RF signal strength may also vary due to signal fading, i.e., the signal strength decreases. Therefore, a hard AGC characteristic hampers proper receiver tuning.

For purposes of accurate tuning, it is desirable that the receiver AGC system provide a somewhat increasing output for increasing signal input, i.e., a "soft" AGC characteristic. Then, the user can accurately tune the receiver by tuning for maximum volume. However, a soft AGC characteristic results in a demodulated L+R signal amplitude that is proportional to RF signal strength, which, for reasons explained above, reduces stereo channel separation.

SUMMARY OF THE INVENTION

This present inventor has found that a relatively hard AGC characteristic is desirable for purposes of stereo channel separation, while a relatively soft AGC characteristic is desirable for purposes of accurate receiver tuning.

The present invention is embodied in an AM stereo receiver system wherein a relatively soft AGC characteristic is provided during a tuning operation, and a relatively hard AGC characteristic is provided after tuning is complete. Specifically, tuning is sensed by a suitable tuning detector. When the output of the tuning detector indicates that the receiver is being tuned, the AGC system is conditioned to provide a relatively soft characteristic. When the output of the tuning detector indicates that the receiver is not being tuned, the AGC system is conditioned to provide a relatively hard characteristic.

BRIEF DESCRIPTION OF THE DRAWINGS

FIG. 1 is a block diagram of an AM stereo receiver system embodying the present invention.

FIG. 2 is a graphical representation of AGC system characteristics for an AM stereo receiver arranged in accordance with the present invention.

DETAILED DESCRIPTION

Figure 3:
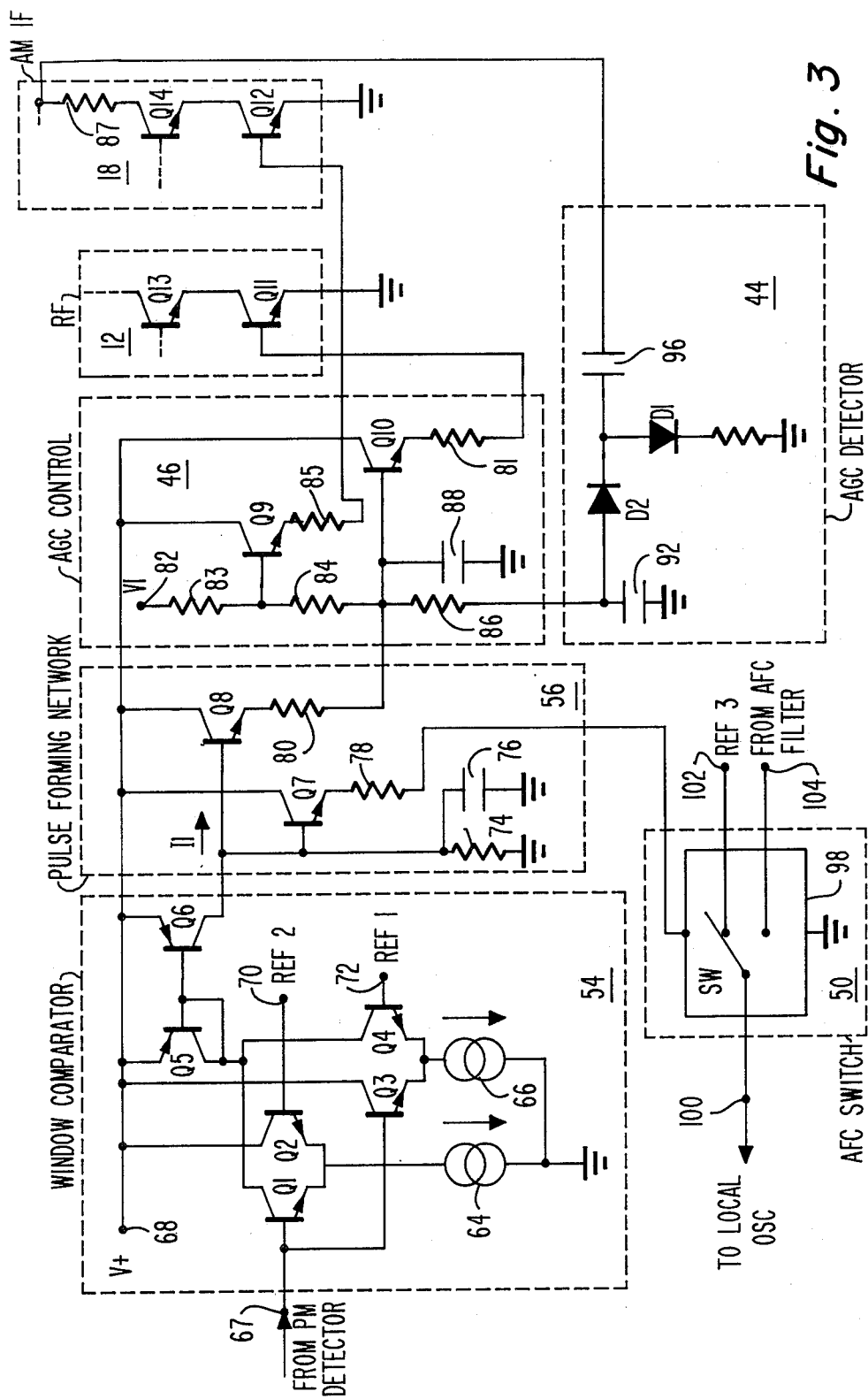
FIG. 3 is a schematic diagram, partially in block form, illustrating circuit details for particular block elements of the system diagram of FIG. 1.

FIG. 1 shows a block diagram of an AM stereo receiver. A particular one of the received RF signals from antenna 10 is selected in accordance with the selected station and amplified in RF stage 12. The signal output from RF stage 12 is heterodyned with an output signal of a local oscillator 16, which has a frequency corresponding to the selected station, in a mixer 14 to form an intermediate frequency (IF) signal. The receiver is tuned by simultaneously adjusting the frequency of a tuned circuit in the local oscillator 16 and a tuned circuit in the RF stage 12. The tuned circuits are mechanically linked together to a tuning knob 9, to track each other as indicated by the dashed line 11.

The IF signal from mixer 14 is fed to an AM IF stage 18 which is in turn connected to an AM detector 20 for extracting the L+R signal. The IF signal from mixer 14 is also fed to an IF and limiter stage 22, which is in turn connected to a phase modulation (PM) detector 24 for extracting the L−R signal.

The output of the PM detector 24 is connected to a 5 hertz filter. When stereo modulation is present, the output of the 5 hertz filter activates a stereo indicator 32 (which may, for example, be a light emitting diode), and also activates a stero separation matrix 34.

The output of the stereo separation matrix 34 is connected to audio amplifiers 36 and 40, which drive speakers 38 and 42, respectively. When enabled, the stereo separation matrix 34 adds the L−R signal to the L+R signal to provide a signal proportional to L to audio amplifier 36, and subtracts the L−R signal from the L+R signal to provide a signal proportional to R to audio amplifier 40. When the stereo separation matrix 34 is not enabled, the L+R signal is provided to both audio amplifiers 36 and 40.

For accurate stereo separation, the amplitude of the demodulated L+R signal should be substantially equal to the amplitude of the demodulated L−R signal. Towards this end, the receiver of FIG. 1 includes an automatic gain control (AGC) system comprising AGC detector 44 and AGC control unit 46. The output of the AGC detector 44 is a signal representative of the peak-to-peak value of the IF signal output from AM IF stage 18. The output of AGC detector 44 is applied to the AGC control 46 which, in turn, controls respective gains of RF stage 12 and AM IF stage 18. Also, a gain tracking stage may be provided between the output of the PM detector 24 and the input of stereo separation matrix 34 for increasing and decreasing the amplitude of the L−R signal to compensate for amplitude variations between the L−R and L+R signals.

When the received RF signal strength increases, the IF signal strength increases, and the signal from AGC detector 44 increases. The AGC control 46 then applies respective gain control signals to RF stage 12 and AM IF stage 18 so as to decrease the gain of one or both stages. When the received RF signal strength decreases, the average IF signal strength decreases, and the signal from AGC detector 44 decreases. The AGC control 46 then applies respective gain control signals to RF stage 12 and AM IF stage 18 so as to increase the gain of one or both stages. Thus, a closed loop gain control system is provided which tends to maintain the IF signal strength at a relatively constant level.

The output of the PM detector 24 is also connected to an automatic frequency control (AFC) system comprising AFC filter 48 and AFC switch 50. The function of AFC switch 50 will be described below. The PM detector 24 includes a frequency discriminator (not specifically shown). The DC component of the output signal of that discriminator represents the frequency deviation of the IF signal from its nominal value. The AFC filter 48 filters the audio modulation from the PM detector 24 output signal to produce its DC component which is applied to a voltage control input of local oscillator 16 through the AFC switch 50 to correct for any frequency deviation of the IF signal due to corresponding deviations of the received RF signal.

The portions of the AM stereo receiver so far described are known to those skilled in the art and require no further detailed explanation. The present invention concerns apparatus for modifying the AGC characteristics when the receiver is being tuned to accommodate accurate tuning consistent with proper stereo channel separation.

Specifically, the output of the PM detector 24 is also connected to a tuning detector 52. The output of the tuning detector 52 is, in turn, connected to the AGC control 46 and the AFC switch 50. The purpose of the tuning detector 52 is to detect when the receiver is being tuned and to change the receiver AGC characteristics accordingly. In accordance with the present invention, when the receiver is not being tuned, a relatively hard AGC system characteristic is provided, and when the receiver is being tuned, a relatively soft AGC system characteristic is provided.

The tuning detector 52 comprises a window comparator 54 connected to a pulse forming network 56. The window comparator 54 provides a first output signal when the input voltage applied thereto is between first and second voltage references above and below the discriminator center voltage, i.e., the voltage corresponding to the nominal receiver IF frequency. The window comparator 54 provides a second output signal when the input voltage applied thereto is outside the voltage "window" established by the first and second voltage references, i.e., above the second or below the first voltage reference. The output of the pulse forming network 56 controls the AGC control 46 and the AFC switch 50 so as to alter the AGC system characteristics and disable the AFC system for a period of timing during which the receiver is being tuned.

The operation of the AGC system of FIG. 1 can be best described in conjunction with the graphical representation of receiver AGC system characteristics illustrated in FIG. 2. In FIG. 2, the horizontal axis represent RF input signal strength at the input of the receiver RF stage 12. The vertical axis represents the IF output signal strength at the output of the IF stage 18. As can be seen from curve 62, the IF signal increases relatively little for increasing RF input signal. Curve 62 therefore illustrates a relatively hard AGC characteristic, which is desirable for adequate stereo signal separation. On the other hand, for curve 60, which has a greater slope as compared to curve 62, the IF signal increase is relatively greater for increased RF input signal. Curve 60 therefore illustrates a relatively soft AGC characteristic which is desirable for accurate receiver tuning.

In operation, assume that the receiver is tuned to a desired station. The output signal from the PM detector 24 has voltage excursions symmetrically above and below the discriminator center voltage but within the voltage window of the window comparator 54. Accordingly, window comparator 54 provides a first output signal to pulse forming network 56 which conditions AGC control 46 to provide the AGC system characteristics illustrated by curve 62 in FIG. 2. At the same time, pulse forming network 56 conditions AFC switch 50 to apply the output of the AFC filter 48 to the voltage control input local oscillator 16 in the normal manner.

Since the AGC system provides a relatively flat AGC system characteristic, as represented by curve 62, the amplitude of the L+R signal is relatively independent of the receiver RF signal strength, which facilitates accurate stereo channel separation.

When the listener changes the receiver tuning, the output signal voltage from the PM detector 24 greatly increases or decreases depending upon whether the receiver is tuned up or down in frequency. In either event, the voltage excursion is such that the output signal of PM detector 24 is outside the voltage window of window comparator 54. In response, window comparator 54 provides a second output signal to pulse forming network 56 which conditions AGC control 46 to provide the AGC system characteristics illustrated by curve 60 in FIG. 2. At the same time, pulse forming network 56 conditions AFC control 50 to apply a voltage reference to the voltage control input of local oscillator 16, thereby disabling the AFC function. Desirably, the latter reference voltage is selected substantially equal to the discriminator center voltage so that when a new station has been tuned, steady state operation of the AFC loop is achieved relatively quickly.

Since the AGC system provides a relatively soft AGC system characteristic, as represented by curve 60, the amplitude of the L+R signal increases with received signal strength, which facilitates the accurate tuning of the receiver since a user is able to tune the receiver by tuning for maximum volume.

When the receiver is properly tuned, the output signal from the PM detector 24 is again within the voltage window of window comparator 54, which again conditions the receiver AGC system to provide a hard AGC characteristic. Preferably, pulse forming network 56 provides a short delay in changing back from its second output signal to its first output signal, so that the user has sufficient time (e.g., 1 second) to tune for maximum volume before the AGC system changes back from its relatively soft characteristic to its relatively hard characteristic.

FIG. 3 shows representative circuit embodiments for particular block elements of FIG. 1. Specifically, circuits are shown for window comparator 54, pulse forming network 56, AGC detector 44, AGC control 46, AFC switch 50, and portions of RF stage 12 and AM IF stage 18, shown in block form in FIG. 1.

Window comparator 54 comprises transistors Q1 and Q2 arranged as a first emitter coupled differential amplifier receiving current from a first current source 64 connected between the emitter electrodes thereof and ground potential. Window comparator 54 further comprises transistor Q3 and Q4 arranged as a second emitter coupled differential amplifier receiving current from a second current source 66 connected between the emitter electrodes thereof and ground potential. The collector electrodes of transistors Q2 and Q3 are connected to terminal 68 which receives an operating potential V+. The collector electrodes of transistors Q1 and Q4 are connected to the input of a current mirror amplifier (CMA) comprising transistors Q5 and Q6. The input of the CMA is at the collector electrode of transistor Q5. The output of window comparator 54 is the output of the CMA at the collector electrode of transistor Q6.

The base electrode of transistor Q4 is connected to terminal 70, which receives a first voltage reference, REF 1. The base electrode of transistor Q2 is connected to terminal 72 which receives a second voltage reference, REF 2. The base electrodes of transistors Q1 and Q3 are connected to terminal 67, which receives the signal from PM detector 24 (FIG. 1).

Pulse forming network 56 comprises resistor 74 and capacitor 76, arranged in parallel to form an RC delay network connected between the output of window comparator 54 at the collector electrode of transistor Q6 and ground potential. An output signal from pulse forming network 56 to AGC control 46 is provided by transistor Q8, arranged in emitter follower configuration. Another output signal from pulse forming network 56 to AFC switch 50 is provided by transistor Q7, arranged in emitter follower configuration in series with a resistor 78.

AFC switch 50 comprises a current operated switch 98 having terminals 100, 102, and 104. Switch 98 is illustrated by its mechanical equivalent for purposes of explanation. When current is provided from the emitter electrode of transistor Q7 through resistor 78, switch 98 connects terminal 102 to terminal 100. When no current is provided, terminal 104 is connected to terminal 100.

Terminal 100 of the AFC switch 50 is also connected to the voltage control input of local oscillator 16 (FIG. 1). Terminal 104 is connected to the output of the AFC filter 48 (FIG. 1). Terminal 102 is arranged for receiving a voltage reference, REF 3, which voltage reference, as explained above, is desirably equal to the discriminator center voltage of the PM detector 24 of FIG. 1.

AGC control 46 comprises resistors 83 and 84, serially connected between terminal 82, which receives a reference potential V1, and a circuit node n. Another resistor 86 is connected between node n and the AGC detector 44. A bypass capacitor 88 is connected between node n and ground potential. The pulse forming network 56 is connected to the AGC control 46 by a resistor 80 connected between node n and the emitter electrode of transistor Q8. The voltage at node n is coupled to RF stage 12 by emitter follower transistor Q9 in series with resistor 85. The voltage at node n is also coupled through the interconnection of resistors 83 and 84 to AM IF stage 18 by emitter follower transistor Q8 and series resistor 81. Thus, the voltage at node n (the AGC voltage) is distributed to RF stage 12 and AM IF stage 18 at different levels of AGC voltage developed at node n. This type of network is commonly referred to as an AGC delay network and, as such, is well known in the art.

RF stage 12 includes a gain control element, i.e., transistor Q11, which is responsive to the AGC voltage at node n for controlling the gain of internal amplifying elements e.g., transistor Q13. Similarly, AM IF stage 18 includes a gain control element, i.e., transistor Q12, which is responsive to the AGC voltage at node n for controlling the gain of internal amplifying elements, e.g., transistor Q14. Generally, the higher the DC voltage at node n, the higher the gain of respective receiver stages 12 and 18 and vice versa.

The output of AM IF stage 18 is connected to the input of AGC detector 44. AGC detector 44 comprises diodes D1 and D2, arranged with capacitors 92 and 96 to form a peak detector circuit. Resistor 94 is included to protect diode D1 from excessive current conditions. On positive voltage excursions of the signal applied to AGC detector 44, diode D1 conducts charging capacitor 96. On negative voltage excursions, diode D1 is reversed-biased, and diode D2 conducts. When diode D2 conducts, the previously stored positive voltage on capacitor 96 is added to the present negative voltage input so that the average current drawn through resistor 86 is proportional to the peak-to-peak value of the IF signal. As a result, an increase in IF signal reduces the voltage at node n and vice versa.

The receiver AGC system, including AGC detector 44 and AGC control 46 in cooperation with RF stage 12 and AM IF stage 18, is disclosed in U.S. Pat. No. 4,249,137, "AMPLIFIER SYSTEM WITH AGC, AS FOR AN AM RADIO," issued in the name of the present inventor, Feb. 3, 1981, and assigned to RCA Corporation. The latter patent is incorporated by reference for its detailed description of these portions. Briefly, an increase in RF signal strength to RF stage 12 tends to cause an increase in IF signal strength at the output of AM IF stage 18. An increase in IF signal to the AGC detector 44 tends to increase the average current drawn through resistor 86, which tends to pull the voltage at node n to a lower potential. A lower potential at node n tends to reduce the gain of respective receiver portions which, in turn, reduces the IF signal. Similarly, a decrease in RF signal strength tends to cause an increase in the gain of respective receiver portions. In such manner, the AGC system adjusts the gain of respective receiver portions in response to changing RF signal conditions.

In operation, assume that the receiver is tuned to a desired station. The signal from the PM detector 24 applied at terminal 67 has voltage excursions between REF 1 and REF 2, i.e., greater than REF 1 but less than REF 2. Therefore, transistors Q2 and Q3 are conductive, and transistors Q1 and Q4 are nonconductive. Transistor Q5 then receives substantially no current, and output current I1 provided by transistor Q6 is essentially zero.

Accordingly, transistor Q7 is nonconductive so that AFC switch 50 is conditioned to connect the output of the AFC filter at terminal 104 to the voltage control input of the local oscillator at terminal 100, and the AFC system operates in the normal manner. Transistor Q8 is also nonconductive. Therefore, no current flows through resistor 80 to node n, and the receiver AGC system operates in the normal manner.

When a user changes the receiver tuning, the signal from the PM detector 24 connected at terminal 67 increases above REF 2 or decreases below REF 1, depending upon whether the receiver is tuned up or down in frequency. If the voltage on terminal 67 is above REF 2, then transistor Q1 conducts. If the voltage on terminal 67 is below REF 1, then transistor Q4 conducts. In either event, collector current is provided to transistor Q5 by one of transistors Q1 or Q4.

Accordingly, transistor Q6 then provides output current I1 from the window comparator 54 to the pulse forming network 56. Current I1 charges capacitor 76. After the time required to charge capacitor 76, emitter follower transistors Q7 and Q8 become conductive.

Current is provided to switch 98 by transistor Q7 through resistor 78, which conditions switch 98 to connect REF 3 at terminal 102 to the voltage control input of the local oscillator at terminal 100. Thus, while the receiver is being tuned, the normal AFC function is disabled.

Transistor Q8 is conditioned to provide output current through resistor 80 to node n, which flows to ground through resistor 86, diodes D1 and D2, and resistor 94. The effect of injecting a current through resistor 80 into node n is to raise the voltage at node n, which increases the gain of the receiver. Normally, if the AGC voltage developed at node n decreases in response to increasing RF signal strength, the gain control voltage applied to the RF and AM IF stages 12, 18, correspondingly decreases. However, the current injected into node n by transistor Q8 increases the voltage at node n, partially cancelling the effect of the reduction in AGC voltage. Furthermore, the bias point of the gain controlling transistor Q11 in RF stage 12, as well as the bias point of the gain controlling transistor Q12 in AM IF stage 18 is increased, so that the AGC voltage itself is less effective. The net result is that the slope of the IF signal strength versus RF signal strength AGC characteristic is increased.

When the listener tunes close to the frequency to the desired station, the voltage signal at terminal 67 again returns to a value between REF 1 and REF 2. Transistors Q1 and Q4 are rendered nonconductive, which causes the output current I1 from window comparator 54 to fall to zero. However, the charge stored on capacitor 76 maintains transistors Q7 and Q8 conductive.

After a time delay, determined by the RC time constant of resistor 74 and capacitor 76, transistors Q7 and Q8 are rendered nonconductive. Thus, a soft AGC system characteristic is maintained for at least a predetermined time after tuning is initiated so that the user can properly tune the receiver to a new station.

It should be understood that various modifications may be made that are intended to be within the scope of the present invention. For example, the tuning detector may detect receiver tuning by alternate means, such as by sensing mechanical motion of the receiver tuning knob. Further, for example, AGC control responsive to the tuning detector output may modify the receiver AGC characteristics by alternate means, such as selectively applying or removing AGC signal to a selected RF or IF stage.

What is claimed is:

1. In an AM stereo system including tuning means for tuning said system to various RF signals corresponding to respective stations to produce an IF signal, at least one gain controlling stage responsive to an AGC signal, and AGC means for generating said AGC signal in response to the strength of said received RF signals, apparatus comprising:

tuning detector means for providing a first signal when said receiver is not being tuned and a second signal when said receiver is being tuned; and gain control means operating in conjunction with said AGC means and responsive to said first signal for establishing a first IF amplitude versus received RF signal strength characteristic and responsive to said second signal for establishing a second IF amplitude versus received RF signal strength characteristic, which second characteristic has a greater slope than said first characteristic.

2. An AM stereo receiver according to claim 1, wherein said receiver includes a phase modulation detector, and said tuning detector means comprises:

window comparator means responsive to the output of said phase modulation detector for providing a first comparator signal when said output of said phase modulation detector is between first and second predetermined voltages, and for providing a second comparator signal when said output of said phase modulation detector is below said first predetermined voltage or above said second predetermined voltage.

3. An AM stereo receiver according to claim 2 further comprising:

pulse forming means responsive to said first and second comparator signals for providing said respective first and second signals to said AGC means, said pulse forming means further providing a predetermined time delay so that said second signal thereof is maintained for said predetermined time delay after the output of said window comparator means changes from said second comparator signal to said first comparator signal.

4. An AM stereo receiver according to claim 1 or 2 or 3, wherein said receiver includes an automatic frequency control system for automatically tuning said tuning means to the frequency of said received signal, said receiver further comprising:

AFC control means responsive to said tuning detector means for disabling said automatic frequency control system when said tuning detector means provides said second signal.

5. An AM stereo receiver according to claim 1, wherein said AGC means includes a circuit node at which said AGC signal is provided, and said gain controlling stage includes a gain control transistor responsive to said AGC signal for controlling the gain thereof, said gain control means further comprising:
  means responsive to said second signal for incrementally changing said AGC signal at said circuit node by a predetermined amount for changing the bias point of said gain control transistor so as to increase the gain of said gain control stage.

* * * * *